us011366391B2

(12) United States Patent
Cha et al.

(10) Patent No.: US 11,366,391 B2
(45) Date of Patent: *Jun. 21, 2022

(54) FABRICATING CALCITE NANOFLUIDIC CHANNELS (71) Applicant: Saudi Arabian Oil Company, Dhahran (SA)

(72) Inventors: Dong Kyu Cha, Abqaiq (SA); Mohammed Badri AlOtaibi, Dhahran (SA); Ali Abdallah Al-Yousef, Dhahran (SA)

(73) Assignee: Saudi Arabian Oil Company, Dhahran (SA)

(*) Notice: Subject to any disclaimer, the term of this patent is extended or adjusted under 35 U.S.C. 154(b) by 65 days.

This patent is subject to a terminal disclaimer.

(21) Appl. No.: 16/898,718

(22) Filed: Jun. 11, 2020

(65) Prior Publication Data

US 2020/0301282 A1 Sep. 24, 2020

Related U.S. Application Data (62) Division of application No. 16/114,906, filed on Aug. 28, 2018, now Pat. No. 10,761,428.

(51) Int. Cl.
G03F 7/20 (2006.01)
C23C 16/455 (2006.01)
(Continued)

(52) U.S. Cl.
CPC ...... *G03F 7/2059* (2013.01); *C23C 16/45525* (2013.01); *G03F 7/0757* (2013.01);
(Continued)

(58) Field of Classification Search
CPC ........ G03F 7/2059; G03F 7/0757; G03F 7/40; G03F 7/325; G03F 7/038; C23C 16/45525; C01P 2004/03; C01P 2004/04
See application file for complete search history.

(56) References Cited

U.S. PATENT DOCUMENTS 4,003,818 A 1/1977 Juillard et al.
4,564,997 A 1/1986 Matsuo
(Continued)

FOREIGN PATENT DOCUMENTS

CN 1556771 12/2004
CN 1681596 10/2005
(Continued)

OTHER PUBLICATIONS

GCC Examination Report in GCC Appln. No. GC 2019-38180, dated Aug. 18, 2020, 5 pages.
(Continued)

*Primary Examiner* — Su C Kim
(74) *Attorney, Agent, or Firm* — Fish & Richardson P.C.

(57) ABSTRACT

A method for fabricating calcite channels in a nanofluidic device is described. A photoresist layer is coated onto a top surface of a silicon nitride (SiN) substrate. After coating the photoresist layer, the photoresist layer is scanned with an electron beam in a predefined pattern. The scanned photoresist is developed to expose portions of the top surface of the SiN substrate in the predefined pattern. Calcite is deposited in the predefined pattern using atomic layer deposition (ALD) using a calcite precursor gas. Using a solvent, a remaining portion of the photoresist layer is removed to expose the deposited calcite in the predefined pattern and on the top surface of the SiN substrate, where a width of the deposited calcite is in range from 50 to 100 nanometers (nm).

6 Claims, 5 Drawing Sheets (51) Int. Cl.
G03F 7/075 (2006.01)
G03F 7/40 (2006.01)
(52) U.S. Cl.
CPC ............ *G03F 7/40* (2013.01); *C01P 2004/03* (2013.01); *C01P 2004/04* (2013.01)

(56) References Cited

U.S. PATENT DOCUMENTS

| | | | |
|---|---|---|---|
| 9,293,750 | B2 | 3/2016 | Yang et al. |
| 10,365,564 | B2 * | 7/2019 | Cha .................... G03F 7/038 |
| 10,926,227 | B2 | 2/2021 | Cha et al. |
| 10,983,439 | B2 * | 4/2021 | Cha .................... G03F 7/2059 |
| 2004/0146803 | A1 | 7/2004 | Kohl et al. |
| 2008/0246052 | A1 | 10/2008 | Hsu |
| 2009/0104564 | A1 | 4/2009 | Yang |
| 2010/0330721 | A1 | 12/2010 | Barlocchi et al. |
| 2011/0123771 | A1 | 5/2011 | Stavis et al. |
| 2011/0296903 | A1 | 12/2011 | Han et al. |
| 2012/0267603 | A1 | 10/2012 | Lee et al. |
| 2013/0125630 | A1 | 5/2013 | Collins et al. |
| 2013/0236698 | A1 | 9/2013 | Stavis et al. |
| 2013/0316329 | A1 | 11/2013 | Yu |
| 2014/0363623 | A1 | 12/2014 | Sun et al. |
| 2016/0363600 | A1 | 12/2016 | Sniadecki et al. |
| 2017/0067836 | A1 | 3/2017 | Hull |
| 2017/0114242 | A1 | 4/2017 | Lloyd et al. |
| 2019/0700566 | | 3/2019 | Kidambi et al. |
| 2021/0162352 | A1 | 6/2021 | Cha et al. |

FOREIGN PATENT DOCUMENTS

| | | |
|---|---|---|
| CN | 108025909 | 5/2018 |
| CN | 111108440 | 5/2020 |
| JP | 2004193525 | 7/2004 |
| JP | 2006514413 | 4/2006 |
| JP | 2006520697 | 9/2006 |
| JP | 2009134255 | 6/2009 |
| JP | 2009539261 | 11/2009 |
| JP | 2010518615 | 5/2010 |
| JP | 2013527103 | 6/2013 |
| JP | 2015128818 | 7/2015 |
| JP | 6947482 | 11/2020 |
| KR | 20160014504 | 2/2016 |
| WO | 2009149362 | 12/2009 |
| WO | 2017009710 | 1/2017 |
| WO | 2019032903 | 2/2019 |

OTHER PUBLICATIONS

CA Office Action in Canadian Appln. No. 3,075,166, dated Apr. 26, 2021, 5 pages.
GCC Examination Report in GCC Appln. No. GC 2019-38756, dated Sep. 29, 2020, 3 pages.
GCC Examination Report in GCC Appln. No. GC 2019-38180, dated Dec. 13, 2020, 4 pages.
Becker et al., "Polymer microfluidic devices," Talanta, vol. 56, No. 2, Feb. 11, 2002, 21 pages.
Lee et al., "Site-Selective In Situ Grown Calcium Carbonate Micromodels with Tunable Geometry, Porosity and Wettability," Advanced Functional Materials, vol. 26, Jul. 1, 2016, 10 pages.
Lifton, "Microfluidics: an enabling screening technology for enhanced oil recovery (EOR)," Lab on a Chip, Royal Society of Chemistry, vol. 16, vol. 10, May 21, 2016, 20 pages.
Lu et al., "Fabrication of Nanostructure by Template Method in Microfluidics," Chinese Journal of Analytical Chemistry, vol. 37, No. 6, Jun. 1, 2009, 6 pages.
Ren et al., "Materials for Microfluidic Chip Fabrication," Accounts of Chemical Research, vol. 46, issue 11, Jun. 11, 2013, 11 pages.
Sander et al., "Template-Assisted Fabrication of Dense, Aligned Arrays of Titania Nanotubes with Well-Controlled Dimensions of Substrates," Advanced Materials, vol. 16, No. 22, Nov. 18, 2004, 6 pages.
Song et al., "Chip-off-the-old-rock: the study of reservoir-relevant geological processes with real-rock micromodels," Lab on a Chip, Royal Society of Chemistry, vol. 14, Sep. 11, 2014, 9 pages.
Spende et al., "TiO2, SiO2, and Al2O3 coated nanopores and nanotubes produced by ALD in etched ion-track membranes for transport measurements," Nanotechnology, vol. 26, Aug. 2015, 12 pages.
Zheng et al., "Surface Effect on Oil Transportation in Nanochannel: a Molecular Dynamics Study," Nanoscale Research letters, vol. 12, No. 1, Jun. 15, 2017, 9 pages.
International Search Report and Written Opinion issued in International Application No. PCT/US2018/046118 dated Nov. 9, 2018, 15 pages.
International Search Report and Written Opinion issued in International Application No. PCT/US2019/048322 dated Jan. 7, 2020, 13 pages.
International Search Report and Written Opinion issued in International Application No. PCT/US2019/063996 dated Mar. 23, 2020, 14 pages.
GCC Examination Report in GCC Appln. No. GC 2018-35814, dated Jan. 30, 2020, 3 pages.
GCC Examination Report in GCC Appln. No. GC 2019-38180, dated Mar. 23, 2021, 4 pages.
Kim et al., "Liquid-cell Transmission Electron Microscopy for Tracking Self-assembly of Nanoparticles," Journal of Visualized Experiments, 2017, 128, 10 pages.
Kim et al., "Potential of nanobubbles generated by ultrasonication in aqueous alkyl polyglycoside solutions," Journal of Colloid and Interface Science, 2000, 223:285-291, 7 pages.
Mo et al, "Formation and stability of ultrasonic generated bulk nanobubbles," Chinese Phys. B, 2018, 27, 118104, 8 pages.
Ohgaki et al., "Physicochemical approach to nanobubble solutions," Chemical Engineering Science, 2010, 65:1296-1300, 5 pages.
Pu et al., "Liquid cell transmission electron microscopy and its applications," Royal Society Open Science, 2020, 24 pages.
Robertson et al., "Nanoparticle Immobilization for Controllable Experiments in Liquid-Cell Transmission Electron Microscopy," ACS Applied Materials & Interfaces, 2018, 10:22801-22808, 8 pages.
JP Office Action in Japanese Appln. No 2021-591756, dated Nov. 2, 2021, 7 pages, with English Translation.
CN Office Action in Chinese Appln. No. 201980087226, dated Dec. 30, 2021, 12 pages, with English Translation.
JP Office Action in Japanese Appln. No 2020-507597, dated Apr. 20, 2021, 5 pages, with English Translation.

* cited by examiner

FABRICATING CALCITE NANOFLUIDIC CHANNELS

CROSS-REFERENCE TO RELATED APPLICATIONS

This application claims the benefit of U.S. application Ser. No. 16/114,906 filed on Aug. 28, 2018, the entire contents of which are incorporated by reference in its entirety.

TECHNICAL FIELD

This specification relates to nanofluidics and more specifically for petrophysical application.

BACKGROUND

Enhanced oil recovery methods are utilized to increase the amount of crude oil that can be extracted from an oil field. At small scales (channel sizes on the order of nanometers or micrometers), fluids can behave differently in that factors such as surface tension begin to dominate the system. With better understanding of fluid behavior at small scales, enhanced oil recovery methods can be improved to extract even more oil from a source rock or reservoir. Microfluidic models which can replicate conditions found in underground reservoirs have been developed to observe, evaluate, and understand physical and chemical phenomena in oil extraction and recovery.

Microfluidics and nanofluidics are considered as an important method to characterize brine and crude oil interactions in petro physics application. For understanding the physical and chemical phenomena of fluid-fluid and fluid-calcite rock interactions at an atomic scale, a nanosize calcite cylindrical channel in a nanofluidic chip can be required. This can be the case for atomic scale analysis that uses transmission electron microscopy (TEM). Conventional calcite channels in microfluidic chips can be fabricated with etched natural calcite crystals, with sizes at a micron scale.

SUMMARY

The present disclosure describes a method of fabricating calcite channels for nanofluidics. Certain aspects of the subject matter described here can be implemented as a method. A photoresist layer is coated onto a top surface of a silicon nitride (SiN) substrate. After coating the photoresist layer, the photoresist layer is scanned with an electron beam in a predefined pattern. The scanned photoresist is developed to expose portions of the top surface of the SiN substrate in the predefined pattern. Calcite is deposited in the predefined pattern using atomic layer deposition (ALD) using a calcite precursor gas. Using a solvent, a remaining portion of the photoresist layer is removed to expose the deposited calcite in the predefined pattern and on the top surface of the SiN substrate, where a width of the deposited calcite is in range from 50 to 100 nanometers (nm).

Advantages of methods and systems described in the present disclosure can include the following. The use of electron beam lithography (EL) can make it easier to control the positions, patterns, and dimensions of fabricated calcite channels. The techniques can be used with transmission electron microscopy (TEM) for atomic scale analysis. The height of channels can be precisely controlled by using atomic layer deposition (ALD).

The details of one or more implementations of the subject matter of this specification are set forth in the accompanying drawings and the description. Other features, aspects, and advantages of the subject matter will become apparent from the description, the drawings, and the claims.

DESCRIPTION OF DRAWINGS

Like reference numbers and designations in the various drawings indicate like elements.

DETAILED DESCRIPTION

The following detailed description describes a method of fabricating calcite channels for nanofluidics, and is presented to enable any person skilled in the art to make and use the disclosed subject matter in the context of one or more particular implementations. Various modifications, alterations, and permutations of the disclosed implementations can be made and will be readily apparent to those or ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

A portion of the world's oil reserves exists in carbonate rocks, such as limestone and dolostone. These rocks, however, can vary considerably in characteristics such as texture, porosity, and permeability, even across areas within a same formation. This variation can create a challenge in achieving a consistent flow of oil. Techniques associated with microfluidics can be used to characterize crude oil interactions with different fluids and with rock formations in petrophysics applications. For example, conventional calcite ($CaCO_3$) channel models can include etched natural calcite crystal, but these models are typically on the scale of micrometers. Fluidics at a nanoscale (that is, on the order of nanometers) can be beneficial in understanding the physical and chemical phenomena of fluid-fluid and fluid-calcite rock interactions at an atomic scale.

The present disclosure describes techniques for fabricating nanosize calcite cylindrical patterned nanofluidic chips by using a combination of electron beam lithography (EL) and atomic layer deposition (ALD). Moreover, a fabricated chip can be packaged with a transparent silicon nitride (SiN)

window and installed in a transmission electron microscopy (TEM) holder. This type of arrangement of the fabricated chip can be used to characterize fluid-fluid or fluid-calcite interactions in the TEM with atomic resolution. These types of characterizations can provide a better understanding of the interaction between fluid-rock and fluid-fluid interactions at higher resolution, such as by using an advanced electron microscopy.

Conventional methods for fabricating channels in microfluidic chips can generally include methods that use glass or silicon etching, photolithography, and polymerization. However, when these techniques are used, it can be difficult to fabricate nanosize cylindrical channels due to resolution issues and challenges that can typically result from the use of these fabrication methods. Fabrication of calcite channels can be more challenging because the fabrication can include etching of natural calcite crystal or thin film-based channel. To observe and study the physical and chemical phenomena in an interface between calcite and brine or crude oil with high-resolution TEM, techniques can be used to fabricate a nanoscale cylindrical calcite channel. The result can mimic real nanoporous structures that occur naturally in reservoir rock.

Techniques that are used with the present disclosure can be based on a combination of electron lithography (EL) and atomic layer deposition (ALD) techniques. In some implementations, the techniques can use steps such as the following.

A SiN substrate can be prepared which will ultimately be the bottom of the chip. The size of the SiN substrate can depend on the size of the hole in the TEM holder and can typically be smaller than the hole (for example, smaller than 3 millimeters (mm) in diameter).

After the SiN substrate is prepared, a photoresist can be spin-coated on the surface of SiN substrate. The photoresist can consist of Polydimethylsiloxane (PDMS) or SU-8 (a non-trademarked material name of a commonly-used photoresist), for example. The thickness of the coated layer can be similar to the height of a calcite channel, for example, and can depend on requirements specified by an end user.

After the photoresist is spin-coated on the surface of the SiN substrate, patterns can be drawn and etched onto the SiN substrate using an EL system. In some implementations, the size of the pattern can be in the range of 50-100 nm of diameter. The diameter will determine the size of subsequent calcite channels.

After the patterns are drawn and etched, the etched hollow patterns can be filled with calcite by using ALD with a calcite precursor gas. After the calcite filling is complete, the photoresist can be removed using a solvent. The removal of the photoresist can leave the SiN substrate as including only fabricated calcite channel structure.

The SiN substrate can be inserted in a liquid cell TEM holder, where a sample (for example, including a liquid or a liquid plus nanoparticles) can be dropped onto (or otherwise introduced into) the SiN substrate. The nanofluidic chip can be sealed with a transparent SiN window. The sealed nanofluidic chip can be placed in a TEM holder that can be inserted into the TEM chamber. Further, the TEM chamber can include an inlet and an outlet that are also connected to the TEM holder.

Use of the SiN substrate in a TEM can make it possible to observe fluid-rock interactions at a nanoscale level or an atomic scale level. Also, fabricated nanoscale calcite channels can provide information that is useful in understanding fluid-calcite interactions inside porous structures. The information can be used to assist in optimizing oil recovery processes in the field. Fabricated nanoscale calcite channels in a nanofluidic chip for use in a TEM liquid cell holder can help in understanding physical and chemical interactions between fluid and calcite at greater resolutions (for example, approaching atomic scale). Compared with conventional methods, EL can more easily control the dimensions of calcite channel at nanoscale levels. Moreover, ALD can provide precisely controlled height of calcite cylindrical channels.

Figure 1:
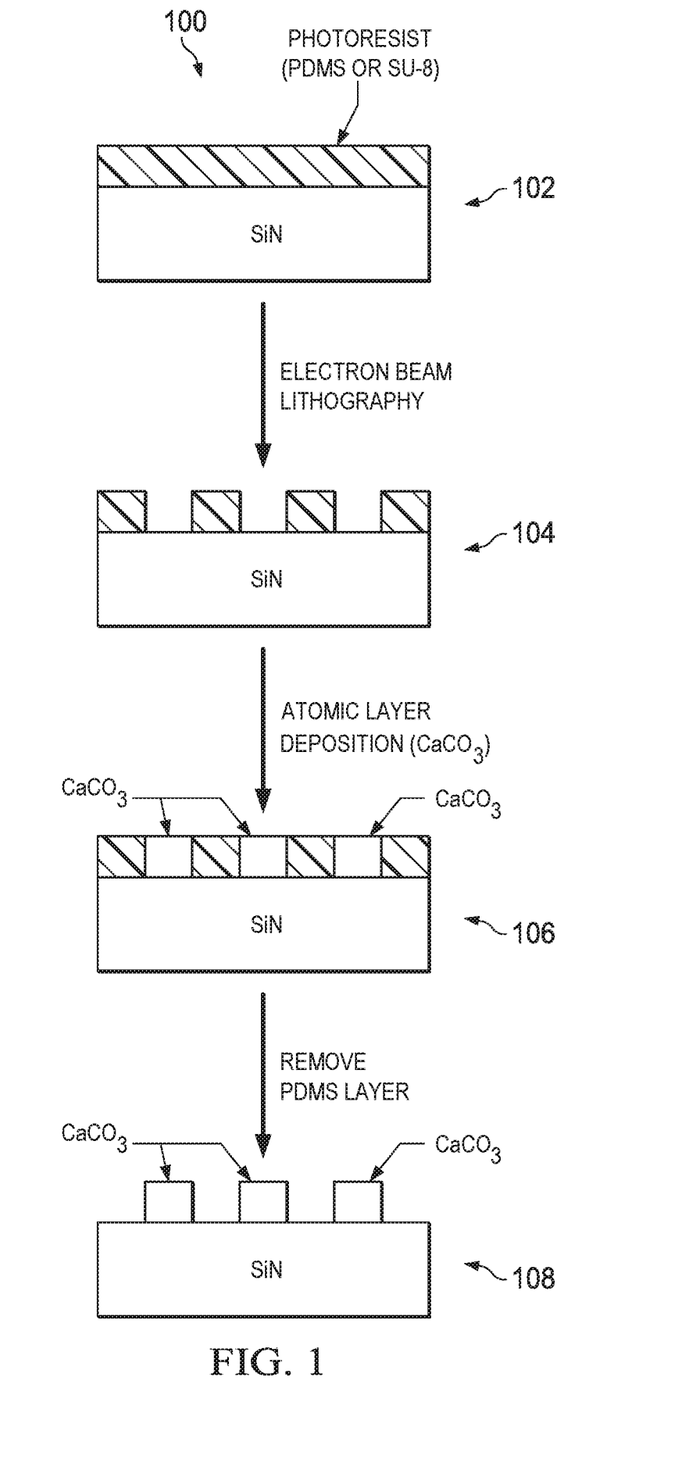
FIG. 1 is a schematic diagram illustrating an example method for fabricating a nanofluidic device, according to an implementation.

FIG. 1 is a schematic diagram illustrating an example of a method 100 for fabricating calcite channels in a nanofluidic device. For example, method 100 can be used in processes for fabricating nanosize calcite cylindrical patterned nanofluidic chips by using a combination of electron beam lithography and atomic layer deposition.

At 102, a photoresist is coated on a substrate. In certain implementations, the photoresist is a negative photoresist, such as polydimethylsiloxane (PDMS) or SU-8. The substrate can have a clean and flat surface and can be made of, for example, silicon. The coating of the photoresist can be performed by spin coating to apply a layer of photoresist on the substrate at a spin rate in a range of approximately 500 to 2000 revolutions per minute (rpm). The spin rate can determine the thickness of the layer of photoresist. The thickness of the layer of photoresist can determine a height of resulting calcite channels in the nanofluidic device. Therefore, the thickness of the photoresist coating can be chosen based on the desired height for the calcite channels in the nanofluidic device, for example, a height less than 10 centimeters (cm). The preparation of photoresist can include edge bead removal (EBR) to remove any buildup of photoresist on the edge of the substrate. The preparation of photoresist can include a baking step which involves baking at approximately 200 degrees Fahrenheit (° F.) for a duration of time, which is dependent on the thickness of the layer of photoresist. The baking temperature can also affect the duration of the baking step. From 102, method 100 proceeds to 104.

At 104, a portion of the photoresist is exposed to a beam of electrons. Exposing a portion of the photoresist to a beam of electrons can cause the portion of the photoresist to be removed. In certain implementations, electron beam lithography can be used to remove the photoresist. Electron beam lithography is a technique for patterning at nanometer (nm) scale and includes scanning a beam of electrons on a photoresist, for example, PDMS. The lithographic process includes exposure of the resist and development of the exposed resist to form a pattern in the remaining resist. Exposure of the resist to an energy source, such as a beam of electrons, modifies the resist physically, chemically, or both. In certain implementations, the beam of electrons can be supplied by a scanning electron microscope (SEM). The exposure of the resist can be followed by a post-exposure baking step that involves baking at approximately 200° F. for a duration of time, which is dependent on the thickness of the layer of photoresist.

The portion of the photoresist that is exposed to the beam of electrons can be exposed in a channel pattern. In general, a portion of the photoresist can be exposed to an energy source and developed to form the channel pattern. Sizes of the channel pattern can be chosen based on the desired size for the calcite channels in the nanofluidic device. For positive resists, the development of the resist can remove the exposed portion of the resist. For negative resists, the development of the resist removes the unexposed portion of the resist. Developing the resist involves dissolving the resist using a solvent and revealing a portion of a surface of the substrate under the photoresist. In certain implementations, the solvent is an organic solvent, such as propylene glycol methyl ether acetate (PGMEA), ethyl lactate, or di-acetone alcohol. The development time depends on the thickness of the layer of photoresist. The portion of photoresist that remains after development forms an inverse pattern of the calcite channels in the finalized nanofluidic device. After development, the device can be rinsed with fresh solvent, followed by a second wash with another solvent, such as isopropyl alcohol. The device can then be dried with a gas, such as nitrogen. From 104, method 100 proceeds to 106.

At 106, calcite is deposited in the channel pattern using a calcite precursor gas. In certain implementations, atomic layer deposition is used to deposit calcite. Atomic layer deposition is a technique for depositing a material from a vapor phase and includes a sequence of alternating introductions of gaseous chemical precursors that react with the substrate. The individual gas-surface reactions are called half-reactions. During each half-reaction, a precursor gas is introduced for a designated amount of time, to allow the precursor gas to fully react with the substrate surface and deposit a single layer at the surface. The device is then purged with an inert gas, such as nitrogen or argon, to remove unreacted precursor, reaction by-products, or both. The next precursor gas is then introduced to deposit another layer and similarly purged. The process cycles as alternating precursor gas is deposited layer by layer until the desired height is reached. In certain implementations, the atomic layer deposition process can continue until the calcite layers reach a similar or same height as the original coating of photoresist. The deposited calcite can have at least one side with a length in a range of approximately 50 to 100 nm. From 106, method 100 proceeds to 108.

At 108, the photoresist remaining after developing the exposed portion of the photoresist in 104 is removed. Removal of the remaining photoresist involves dissolving the photoresist using a solvent, such as the solvent used in developing the resist in 104. The remaining calcite and substrate form the nanofluidic device. After 108, method 100 stops.

Figure 2A:
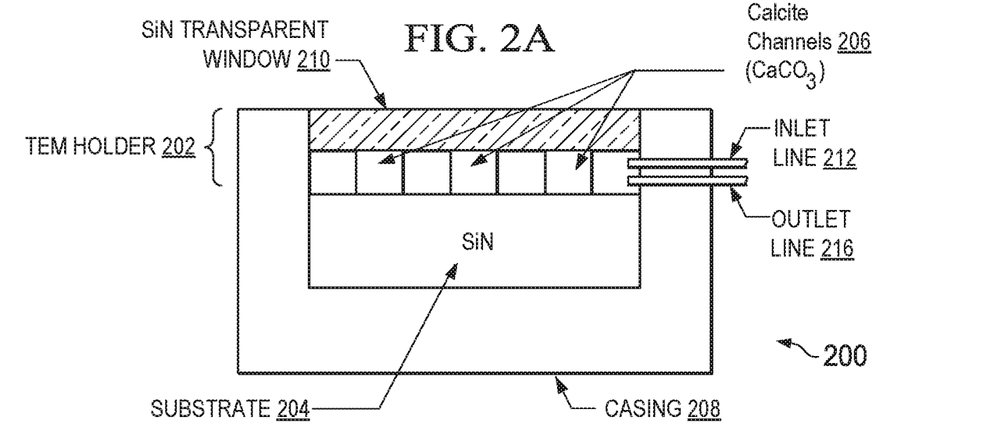
FIG. 2A is a cross-sectional view of a schematic diagram illustrating an example of a nanofluidic device, according to an implementation.
Figure 2B:
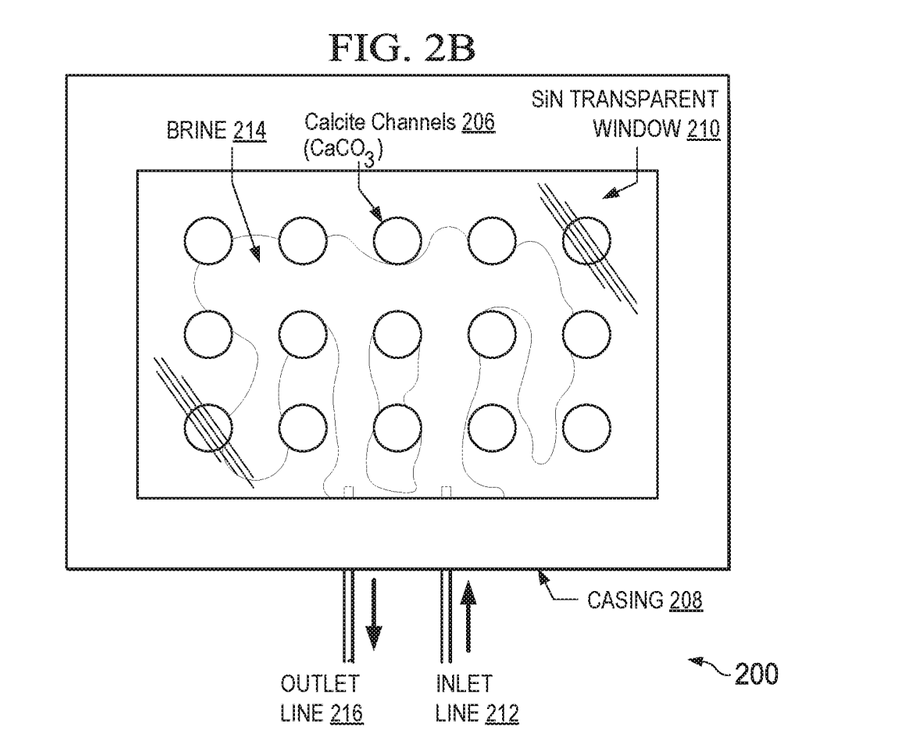
FIG. 2B is a top view of a schematic diagram illustrating an example of a nanofluidic device, according to an implementation.

FIGS. 2A and 2B illustrate a cross-sectional view and a top view, respectively, of an example nanofluidic device 200. The device 200 includes a TEM holder 202 that holds a silicon substrate 204 and calcite channels 206. The calcite deposits that make up the channels 206 can have any shape, such as a cylinder or a cuboid. In addition to varying calcite deposit shapes, the pattern of the calcite channels 206 can be varied. For example, the channels 206 can have a stacked row pattern, where the center of each calcite deposit is in line with a center of a calcite deposit in a row directly above or a row directly below, as illustrated in FIG. 2B. In some implementations, the channels 206 can have a shifted row pattern, where the center of each calcite deposit is not in line with a center of any calcite deposit in a row directly above or a row directly below. The straight or curved edges of the calcite deposits and the channel pattern can represent a variety of geometries that occur in natural calcite reservoirs. In some implementations, the calcite channels 206 of the nanofluidic device 200 can have a length in a range of 50 to 100 nm in at least one dimension. For example, the width of each calcite channel 206 can be in the range of 50 to 100 nm.

Figure 3:
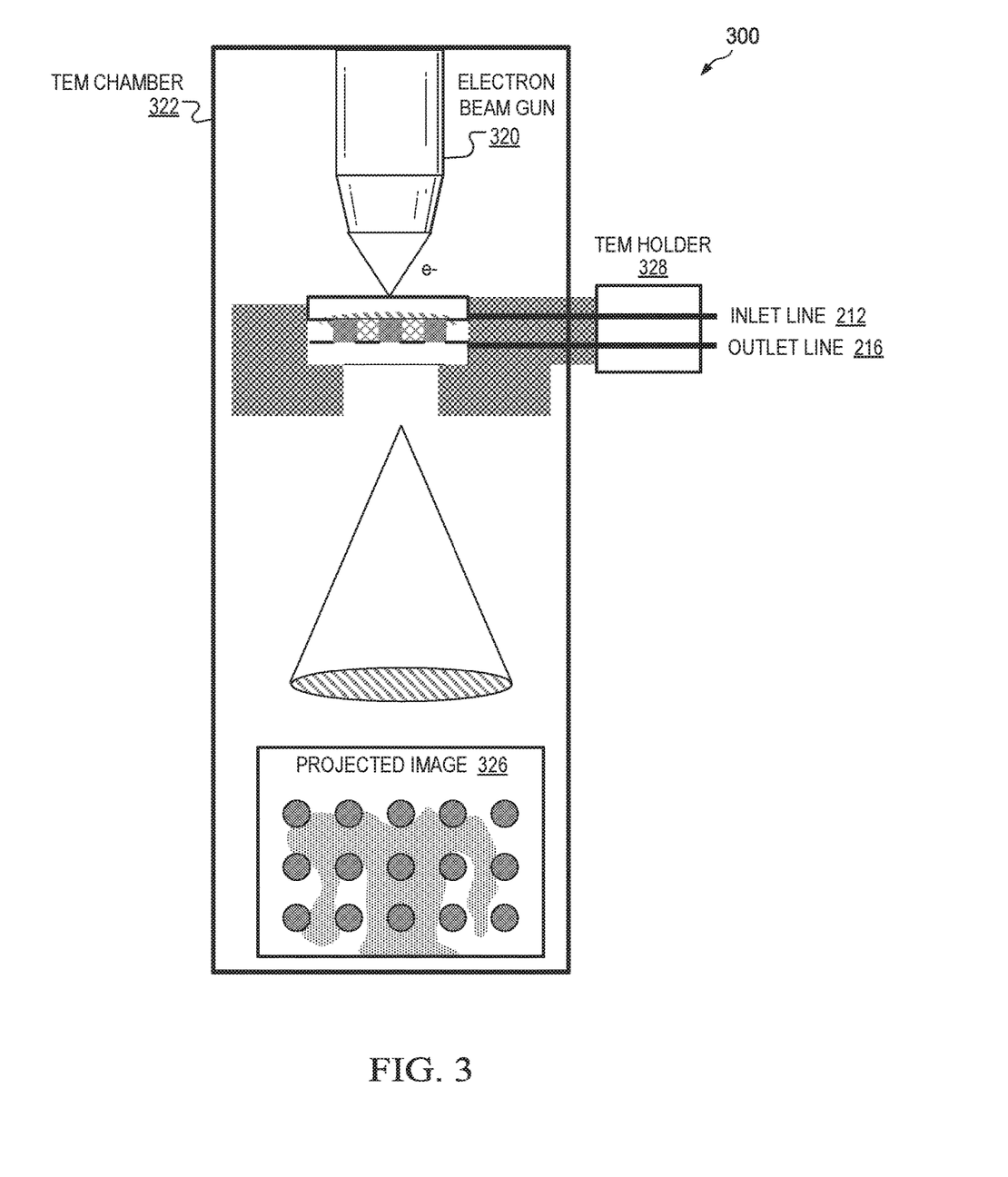
FIG. 3 is a schematic diagram illustrating an example of a nanofluidic device system, according to an implementation.

Still referring to FIGS. 2A and 2B, the silicon substrate 204 and the calcite channels 206 can be packaged in a casing 208 with a window 210 transparent to an electron beam on top of the calcite channels 206. In certain implementations, the casing 208 can be made of a conductive metal, and the window 210 can be made of an electrically conductive material that is also optically transparent, such as silicon nitride (SiN). Electrical conductivity allows the window 210 to avoid accumulating an electric charge, and the transparency of the window 210 allows observation. As illustrated, the casing has an inlet line 212 that allows a fluid, such as brine solution 214, to enter the nanofluidic device 200 and an outlet line 216 that allows fluid to exit. As shown in FIGS. 2A, 2B, and 3, the inlet line 212 and outlet line 216 can be located on the same side of the device 200. In some implementations, the inlet line 212 and outlet line 216 can be located on opposite or adjacent sides of the device 200.

FIG. 3 illustrates an example system 300 for testing a nanofluidic device 200. For example, the system 300 can image a reaction between the calcite channels 206 and a fluid. The nanofluidic device 200 is positioned on a sample stage located inside a TEM chamber 322. The TEM chamber 322 can isolate the device 200 from outside interference and can be evacuated—that is, a vacuum can be produced within the chamber. Fluid, such as brine solution, can be introduced, by way of a TEM holder 328, to the device by inlet line 212, and the fluid can exit by outlet line 216. As fluid flows into and out of the device 200, an electron beam gun 320 emits an electron beam to produce a projected image 326 of the calcite channels 206 while interacting with the fluid. The electron beam gun 320, the TEM chamber 322, and sample stage can be components of a single apparatus, such as an SEM. In certain implementations, the electron beam gun 320 is the same source of electrons used to perform electron beam lithography in fabricating the nanofluidic device 200, for example, a modified SEM capable of performing electron beam lithography.

Calcite reservoirs are typically heterogeneous. Some areas of the reservoir can contain large voids, whereas other areas can have poor connectivity and low permeability. Acid injection is an enhanced oil recovery method that can increase the connectivity of an area of a reservoir. Acid injection can include a brine solution 214 with acid content, for example 10% hydrochloric acid. Acid injection causes carbonate dissolution, and the dynamics of formation dissolution due to acid flow on a pore-scale and an atomic-scale can determine the net flow behavior. The dynamics can also determine other reservoir characteristics such as likelihood for leakage, oil and gas recovery, and storage capacity. As brine solution 214 flows through the nanofluidic device 200, the SEM can be utilized to observe calcite dissolution and preferential flow of brine at a nanometer scale in the device 200. The observations can then be used to quantify acid dissolution of carbonates and to predict the migration of brine through aquifers, such as calcite formations.

Figure 4:
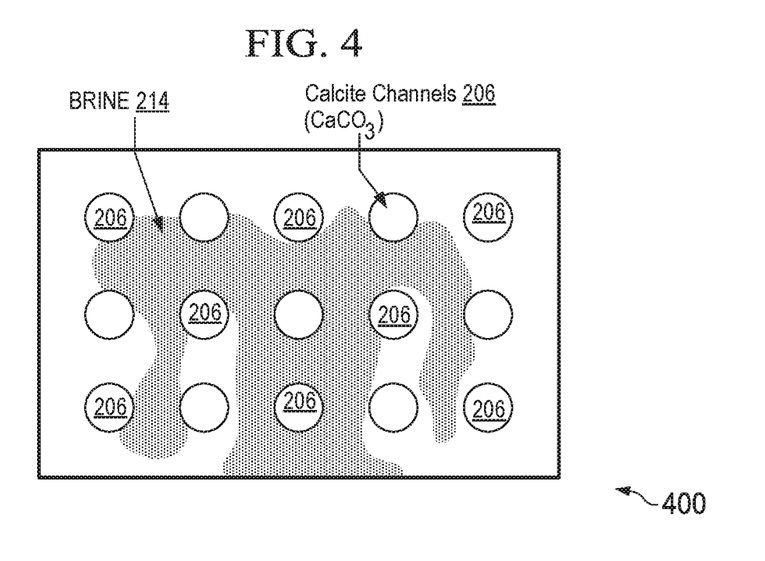
FIG. 4 is a representation of an example of an image that be produced by the system.

FIG. 4 is a representation of an example of an image 400 that be produced by the system 300. Locations in FIG. 4 of the calcite channels 206 and the brine 214 are based on the locations of the calcite channels 206 and the brine 214 in FIG. 2B. A user reviewing the image 400 can learn information, for example, about the interactions between fluid-fluid and fluid-calcite rock interactions at an atomic scale.

Figure 5:
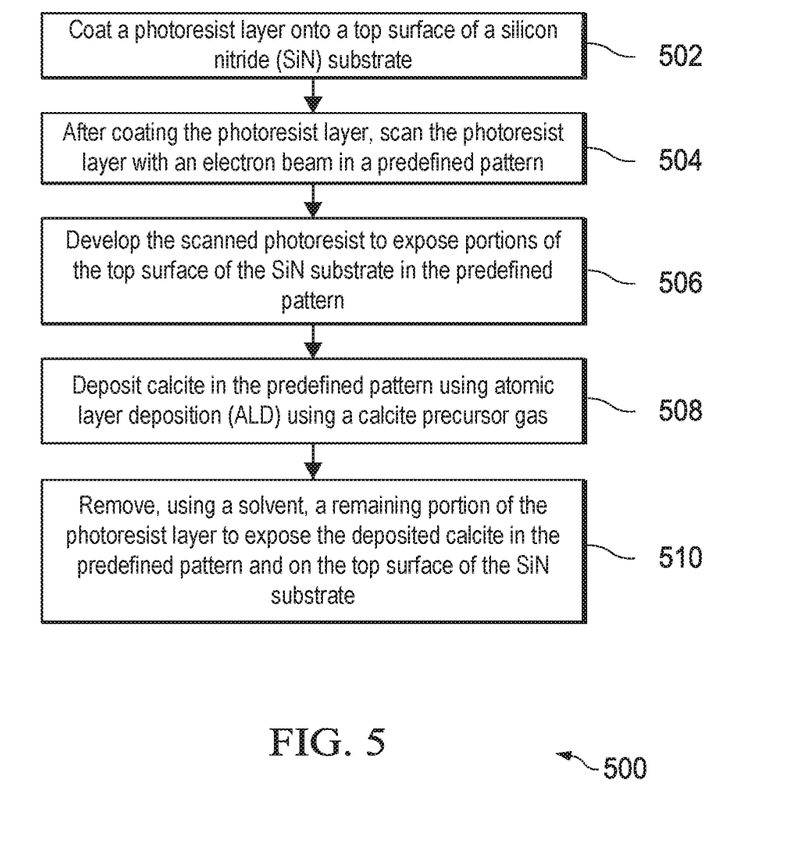
FIG. 5 is a flowchart of an example method for fabricating a nanofluidic device, according to an implementation.

FIG. 5 is a flowchart illustrating an example method 500 for fabricating a SiN substrate. The size and shape of the substrate can be determined, for example, by a sample stage of an SEM. In certain implementations, a nanofluidic device containing the SiN substrate can be packaged, and the size of the substrate can be smaller than a size of a hole in the TEM holder. In certain implementations, substrate preparation can include cleaning of the substrate.

At 502, a top surface of a silicon nitride (SiN) substrate is coated with a photoresist layer. For example, coating the photoresist layer can use an epoxy-based negative photoresist layer that is spin-coated on the surface of the SiN substrate. In certain implementations, the epoxy-based negative photoresist is polydimethylsiloxane (PDMS) or SU-8. A number of parameters can determine the thickness of the coated layer of photoresist such as a spin rate, a photoresist viscosity, a temperature, and other parameters. In some implementations, the thickness can equal a desired height of calcite channels in a nanofluidic device.

At 504, after coating the photoresist layer, the photoresist layer is scanned with an electron beam in a predefined pattern. Forming channel patterns can involve, for example, exposing a portion of the photoresist to a beam of electrons from an SEM. For example, a beam of electrons can be supplied by a scanning electron microscope. The exposure of the resist can be followed by a post-exposure baking step that includes, for example, baking at approximately 200° F. for a duration of time, which is dependent on the thickness of the layer of the photoresist.

At 506, the scanned photoresist is developed to expose portions of the top surface of the SiN substrate in the predefined pattern. The exposed portion of the photoresist is developed, that is, removed. Developing the photoresist involves dissolving the photoresist using a solvent, such as PGMEA, ethyl lactate, or di-acetone alcohol. Developing the photoresist also involves revealing a portion of surface of the substrate.

At 508, calcite is deposited in the predefined pattern using atomic layer deposition (ALD) using a calcite precursor gas. For example, after the patterns are drawn and etched, the etched hollow patterns can be filled with calcite by using ALD with a calcite precursor gas. Calcite is deposited in the channel patterns using atomic layer deposition with calcite precursor gas. Atomic layer deposition involves depositing calcite, layer by layer. In certain implementations, calcite is deposited layer by layer until the calcite channel height is similar to or the same as the original height of the coated photoresist at 504.

At 510, using a solvent, a remaining portion of the photoresist layer is removed to expose the deposited calcite in the predefined pattern and on the top surface of the SiN substrate. The calcite channel structure is deposited on the substrate and the substrate remain. The formed calcite channels can have a length in a range of 50 to 100 nm in at least one dimension.

The casing can include a top portion with a window, a bottom portion that can hold the device, an inlet connection to allow a fluid to enter the device, and an outlet connection to allow the fluid to exit the device. The window can be made of an electrically conductive and optically transparent material, such as SiN, and can be set on top of the calcite channels deposited on the substrate. In certain implementations, the package includes a metal casing around the substrate.

In certain implementations, method 500 further includes steps for injecting, imaging, and removing a sample. The sample can be, for example, a liquid or a liquid containing nanoparticles. The SiN substrate can be inserted into a liquid cell TEM holder having an inlet and an outlet. Then, a sample can be deposited onto the SiN substrate and the deposited calcite, and the chip can be sealed with a window on the TEM holder. In certain implementations, the window includes an electrically conductive and optically transparent SiN window. The chip can be imaged using a TEM while injecting the sample through the inlet, and the sample can be removed through the outlet.

In some implementations, method 500 can be implemented using one or more computers. For example, computers can be used to automate a machine or other equipment to perform some or all of the steps of method 500.

Described implementations of the subject matter can include one or more features, alone or in combination.

For example, in a first implementation, a method includes the following steps. A photoresist layer is coated onto a top surface of a SiN substrate. After coating the photoresist layer, the photoresist layer is scanned with an electron beam in a predefined pattern. The scanned photoresist is developed to expose portions of the top surface of the SiN substrate in the predefined pattern. Calcite is deposited in the predefined pattern using ALD using a calcite precursor gas. Using a solvent, a remaining portion of the photoresist layer is removed to expose the deposited calcite in the predefined pattern and on the top surface of the SiN substrate, where a width of the deposited calcite is in range from 50 to 100 nm.

The foregoing and other described implementations can each, optionally, include one or more of the following features:

A first feature, combinable with any of the following features, the method can further include the following steps. The SiN substrate can be inserted into a liquid cell TEM holder having an inlet and an outlet. A sample can be deposited onto the SiN substrate and the deposited calcite. The chip can be sealed with a window on the TEM holder. The chip can be imaged using a TEM while injecting the sample through the inlet and removing the sample through the outlet.

A second feature, combinable with any of the previous or following features, wherein a size of the SiN substrate depends on, and is smaller than, a size of a hole in the TEM holder.

A third feature, combinable with any of the previous or following features, wherein coating the photoresist layer uses an epoxy-based negative photoresist layer that is spin-coated on the surface of the SiN substrate.

A fourth feature, combinable with any of the previous or following features, wherein the epoxy-based negative photoresist is polydimethylsiloxane (PDMS) or SU-8.

A fifth feature, combinable with any of the previous or following features, wherein the sample is a liquid or a liquid containing nanoparticles.

A sixth feature, combinable with any of the previous or following features, wherein the solvent includes propylene glycol methyl ether acetate (PGMEA), ethyl lactate, or di-acetone alcohol.

A seventh feature, combinable with any of the previous or following features, wherein the window includes an electrically conductive and optically transparent SiN window.

In a second implementation, a system, includes a nanofluidic device, a casing for the device; and an electron source for providing a beam of electrons. The device includes a bottom portion that includes a substrate and a top portion that includes a calcite channel structure. The calcite channel structure includes at least one side having a length in a range of approximately 50 to 100 nanometers.

The foregoing and other described implementations can each, optionally, include one or more of the following features:

A first feature, combinable with any of the following features, wherein the substrate is silicon.

A second feature, combinable with any of the following features, wherein the electron source is a scanning electron microscope (SEM).

A third feature, combinable with any of the following features, wherein the casing includes: a top portion including a window; a bottom portion configured to hold the device; an inlet line configured to allow a fluid to enter the device; and an outlet line configured to allow the fluid to exit the device.

A fourth feature, combinable with any of the following features, wherein the window includes an electrically conductive and optically transparent material.

A fifth feature, combinable with any of the following features, wherein in the electrically conductive and optically transparent material includes silicon nitride (SiN).

While this specification contains many specific implementation details, these should not be construed as limitations on the scope of any implementation or on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain this disclosure. Other changes, substitutions, and alterations are also possible without departing from the spirit and scope of this disclosure.

What is claimed is:

1. A system comprising:
    a nanofluidic device, wherein the nanofluidic device comprises a bottom portion comprising a substrate and a top portion comprising a calcite channel structure, the calcite channel structure comprising at least one side having a length in a range of approximately 50 to 100 nanometers;
    a casing for the device; and
    an electron source for providing a beam of electrons.
2. The system of claim 1, wherein the substrate comprises silicon.
3. The system of claim 1, wherein the electron source is a scanning electron microscope (SEM).
4. The system of claim 1, wherein the casing comprises:
    a top portion comprising a window;
    a bottom portion configured to hold the device;
    an inlet line configured to allow a fluid to enter the device; and
    an outlet line configured to allow the fluid to exit the device.
5. The system of claim 4, wherein the window comprises an electrically conductive and optically transparent material.
6. The system of claim 5, wherein the electrically conductive and optically transparent material comprises silicon nitride (SiN).

* * * * *